(12) United States Patent
Chen et al.

(10) Patent No.: US 11,996,399 B2
(45) Date of Patent: May 28, 2024

(54) HYBRID BONDING WITH UNIFORM PATTERN DENSITY

(71) Applicant: Taiwan Semiconductor Manufacturing Co., Ltd., Hsinchu (TW)

(72) Inventors: Szu-Ying Chen, Toufen Township (TW); Dun-Nian Yaung, Taipei (TW)

(73) Assignee: TAIWAN SEMICONDUCTOR MANUFACTURING COMPANY, LTD., Hsin-Chu (TW)

( * ) Notice: Subject to any disclaimer, the term of this patent is extended or adjusted under 35 U.S.C. 154(b) by 0 days.

(21) Appl. No.: 17/651,881

(22) Filed: Feb. 21, 2022

(65) Prior Publication Data

US 2022/0173092 A1 Jun. 2, 2022

Related U.S. Application Data

(63) Continuation of application No. 16/544,395, filed on Aug. 19, 2019, now Pat. No. 11,257,805, which is a
(Continued)

(51) Int. Cl.
*H01L 25/00* (2006.01)
*H01L 23/00* (2006.01)
(Continued)

(52) U.S. Cl.
CPC .......... *H01L 25/50* (2013.01); *H01L 23/5226* (2013.01); *H01L 23/528* (2013.01); *H01L 23/585* (2013.01); *H01L 24/09* (2013.01); *H01L 24/81* (2013.01); *H01L 25/0657* (2013.01); *H01L 25/18* (2013.01); *H01L 27/14634* (2013.01); *H01L 27/14636* (2013.01); *H01L 27/1464* (2013.01); *H01L 27/14643* (2013.01);
(Continued)

(58) Field of Classification Search
CPC ........... H01L 27/1463; H01L 27/14612; H01L 27/14636; H01L 27/14627
See application file for complete search history.

(56) References Cited

U.S. PATENT DOCUMENTS 788,488 A 4/1905 Miller
7,211,826 B2 5/2007 Park et al.
(Continued)

FOREIGN PATENT DOCUMENTS

CN 1592520 A 3/2005
CN 1753169 A 3/2006
(Continued)

*Primary Examiner* — Monica D Harrison
*Assistant Examiner* — Andre C Stevenson
(74) *Attorney, Agent, or Firm* — Slater Matsil, LLP (57) ABSTRACT

A chip includes a semiconductor substrate, integrated circuits with at least portions in the semiconductor substrate, and a surface dielectric layer over the integrated circuits. A plurality of metal pads is distributed substantially uniformly throughout substantially an entirety of a surface of the chip. The plurality of metal pads has top surfaces level with a top surface of the surface dielectric layer. The plurality of metal pads includes active metal pads and dummy metal pads. The active metal pads are electrically coupled to the integrated circuits. The dummy metal pads are electrically decoupled from the integrated circuits.

20 Claims, 9 Drawing Sheets

Related U.S. Application Data continuation of application No. 15/082,216, filed on Mar. 28, 2016, now Pat. No. 10,388,642, which is a continuation of application No. 14/229,138, filed on Mar. 28, 2014, now Pat. No. 9,299,736.

(51) Int. Cl.

| | | |
|---|---|---|
| *H01L 23/522* | (2006.01) | |
| *H01L 23/528* | (2006.01) | |
| *H01L 23/58* | (2006.01) | |
| *H01L 25/065* | (2023.01) | |
| *H01L 25/18* | (2023.01) | |
| *H01L 27/146* | (2006.01) | |

(52) U.S. Cl.
CPC .............. *H01L 24/05* (2013.01); *H01L 24/06* (2013.01); *H01L 24/48* (2013.01); *H01L 2224/04042* (2013.01); *H01L 2224/05025* (2013.01); *H01L 2224/05568* (2013.01); *H01L 2224/0557* (2013.01); *H01L 2224/056* (2013.01); *H01L 2224/06515* (2013.01); *H01L 2224/08052* (2013.01); *H01L 2224/08146* (2013.01); *H01L 2224/0913* (2013.01); *H01L 2224/09515* (2013.01); *H01L 2224/09517* (2013.01); *H01L 2224/48463* (2013.01); *H01L 2224/8122* (2013.01); *H01L 2224/81359* (2013.01); *H01L 2924/00014* (2013.01); *H01L 2924/12043* (2013.01); *H01L 2924/14* (2013.01); *H01L 2924/1433* (2013.01); *H01L 2924/1434* (2013.01); *H01L 2924/1436* (2013.01); *H01L 2924/1437* (2013.01)

(56) References Cited

U.S. PATENT DOCUMENTS

| | | | |
|---|---|---|---|
| 7,381,635 B2 | 6/2008 | Cabral, Jr. et al. | |
| 7,393,770 B2* | 7/2008 | Wood | H01L 21/76898 |
| | | | 438/458 |
| 7,417,304 B2 | 8/2008 | Tsutsue | |
| 8,174,124 B2* | 5/2012 | Chiu | H01L 21/6835 |
| | | | 257/E23.101 |
| 8,334,582 B2 | 12/2012 | Jeng et al. | |
| 8,436,472 B2 | 5/2013 | Chen | |
| 8,581,389 B2 | 11/2013 | Chen et al. | |
| 8,928,153 B2* | 1/2015 | Haba | H01L 25/105 |
| | | | 257/E23.079 |
| 9,601,443 B2 | 3/2017 | Tsai et al. | |
| 2003/0234448 A1 | 12/2003 | Batra et al. | |
| 2005/0087859 A1 | 4/2005 | Chao et al. | |
| 2006/0096778 A1 | 5/2006 | Yun | |
| 2007/0187823 A1 | 8/2007 | Tanaka et al. | |
| 2009/0273097 A1 | 11/2009 | Hedler | |
| 2010/0027225 A1 | 2/2010 | Yuda et al. | |
| 2011/0102657 A1* | 5/2011 | Takahashi | H01L 21/76898 |
| | | | 257/E27.122 |
| 2013/0307103 A1 | 11/2013 | Lin et al. | |
| 2013/0341800 A1 | 12/2013 | Tu et al. | |
| 2014/0145338 A1 | 5/2014 | Fuji et al. | |
| 2014/0203397 A1 | 7/2014 | Yen et al. | |

FOREIGN PATENT DOCUMENTS

| | | |
|---|---|---|
| CN | 101000880 A | 7/2007 |
| CN | 101246859 A | 8/2008 |
| CN | 101548371 A | 9/2009 |
| CN | 101615598 A | 12/2009 |
| CN | 101663926 A | 3/2010 |
| CN | 102148205 A | 8/2011 |
| CN | 102800650 A | 11/2012 |
| CN | 103503122 A | 1/2014 |
| WO | 2012161044 A1 | 11/2012 |

\* cited by examiner

HYBRID BONDING WITH UNIFORM PATTERN DENSITY

PRIORITY CLAIM AND CROSS-REFERENCE

This application is a continuation of U.S. patent application Ser. No. 16/544,395, entitled "Hybrid Bonding with Uniform Pattern Density," filed Aug. 19, 2019, which is a continuation of U.S. patent application Ser. No. 15/082,216, entitled "Hybrid Bonding with Uniform Pattern Density," filed Mar. 28, 2016, now U.S. Pat. No. 10,388,642 issued Aug. 20, 2019, which is a continuation of U.S. patent application Ser. No. 14/229,138, entitled "Hybrid Bonding with Uniform Pattern Density," filed on Mar. 28, 2014, now U.S. Pat. No. 9,299,736 issued Mar. 29, 2016, which applications are incorporated herein by reference.

BACKGROUND

In wafer-to-wafer bonding technology, various methods have been developed to bond two package components (such as wafers) together. The available bonding methods include fusion bonding, eutectic bonding, direct metal bonding, hybrid bonding, and the like. In the fusion bonding, an oxide surface of a wafer is bonded to an oxide surface or a silicon surface of another wafer. In the eutectic bonding, two eutectic materials are placed together, and are applied with a high pressure and a high temperature. The eutectic materials are hence molten. When the melted eutectic materials are solidified, the wafers are bonded together. In the direct metal-to-metal bonding, two metal pads are pressed against each other at an elevated temperature, and the inter-diffusion of the metal pads causes the bonding of the metal pads. In the hybrid bonding, the metal pads of two wafers are bonded to each other through direct metal-to-metal bonding, and an oxide surface of one of the two wafers is bonded to an oxide surface or a silicon surface of the other wafer.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "under," "below," "lower," "over," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Figure 1:
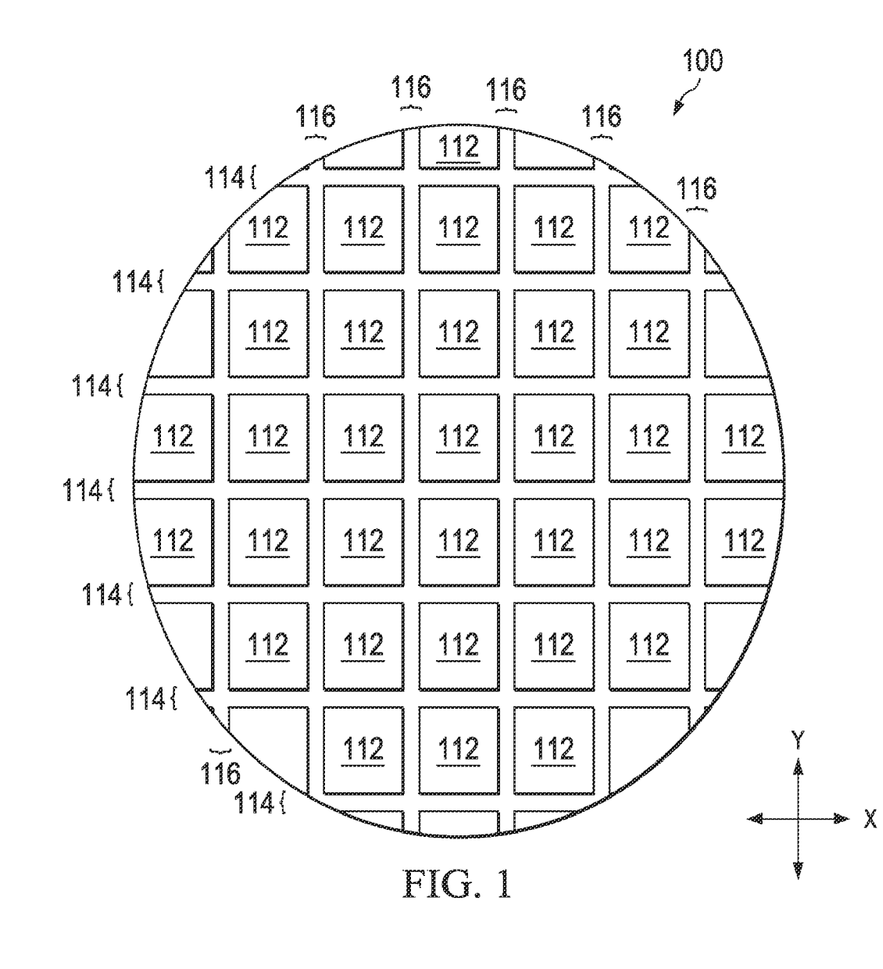
FIG. 1 illustrates a schematic top view of a first wafer in accordance with some embodiments.

FIG. 1 illustrates a schematic top view of wafer 100 in accordance with some exemplary embodiments. Wafer 100 includes chips 112 and the adjoining scribe lines 114 and 116, wherein scribe lines 114 and 116 separate chips 112 from each other. Scribe lines 114 have longitudinal directions parallel to the X direction, and scribe lines 116 have longitudinal directions parallel to the Y direction, which is perpendicular to the X direction. In each of chips 112, there may be a seal ring (shown as 136 in FIG. 9, not shown in FIG. 1) formed, wherein the outer boundaries of the seal rings define the outer boundaries of chips 112. Each of the scribe lines 114 is between and adjoining two rows of chips 112, and each of the scribe lines 116 is between and adjoining two columns of chips 112. It is noted that wafer 100 is not drawn in scale, and the sizes of chips 112, scribe lines 114 and 116, etc. are rescaled for clarity.

Figure 2:
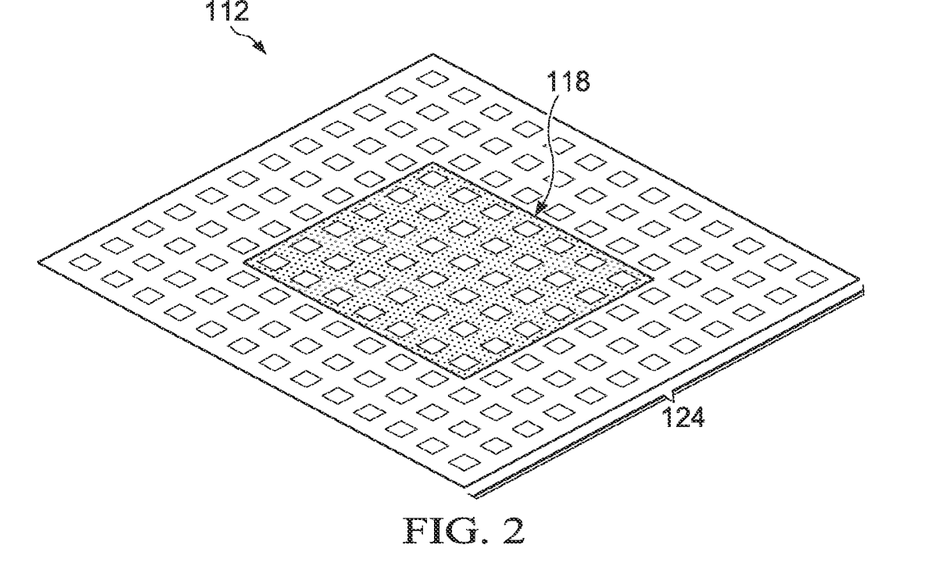
FIG. 2 illustrates a schematic perspective view of a chip in the first wafer in accordance with some embodiments.
Figure 4:
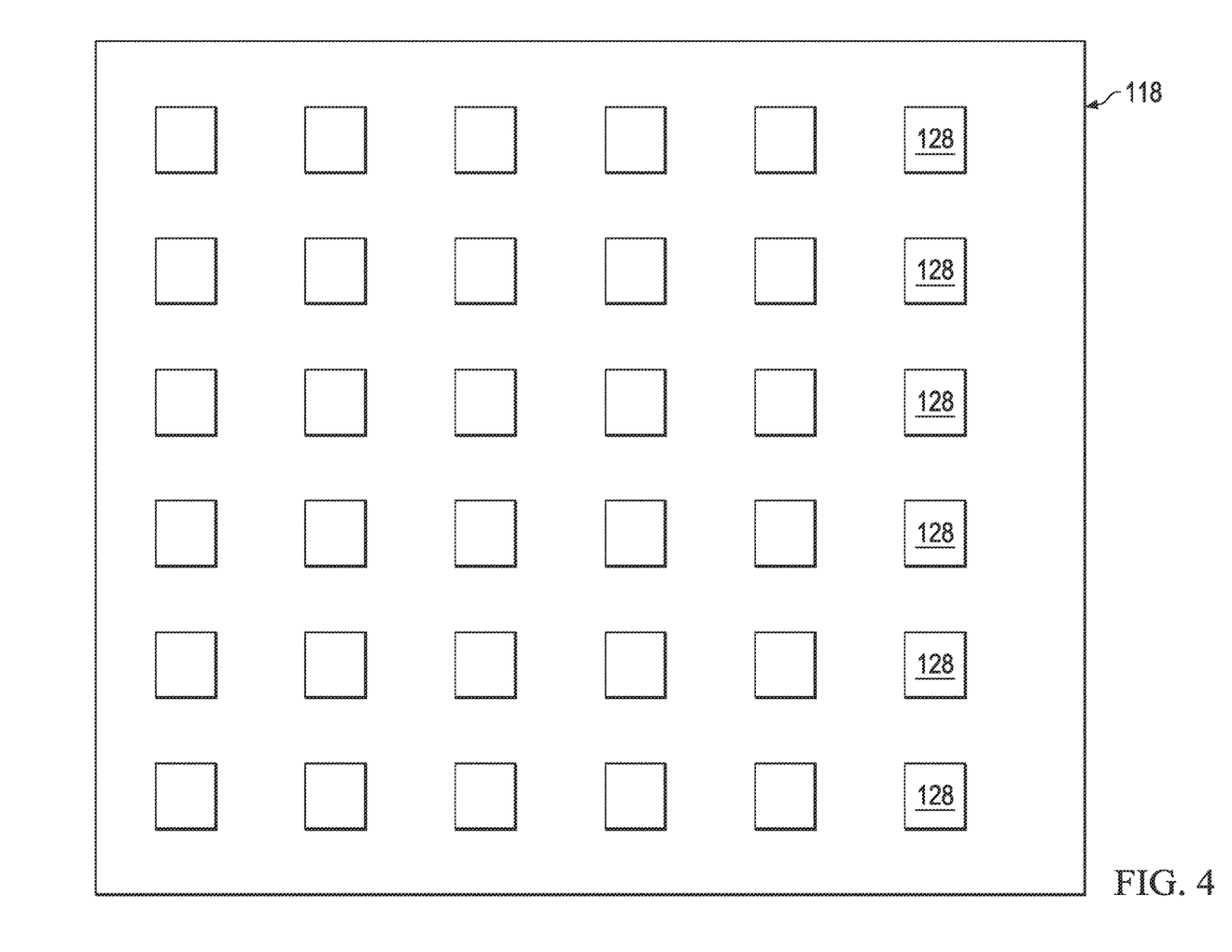
FIG. 4 illustrates a schematic top view of an array in the first chip in accordance with some embodiments.

FIG. 2 illustrates a schematic perspective view of chip 112, which is a part of wafer 100. In some embodiments, chip 112 comprises array-containing circuit 118. Array-containing circuit 118, although referred to as being an array, may also have other repeated patterns such as the beehive-shaped pattern. An exemplary array-containing circuit 118 is schematically illustrated in FIG. 4, which shows a top view. Array-containing circuit 118 includes a plurality of cells 128, which may be arranged as an array comprising a plurality of rows and a plurality of columns.

Figure 11:
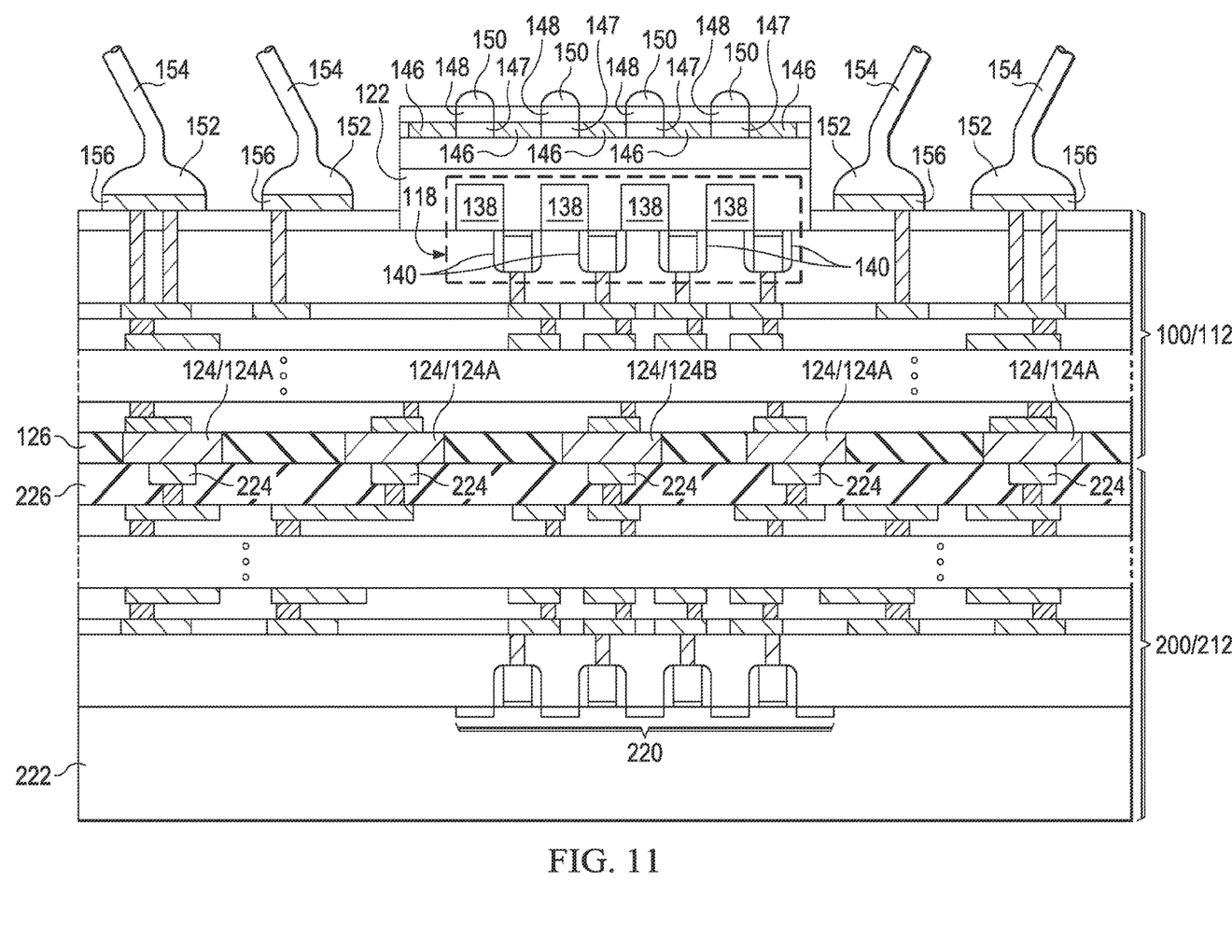
FIG. 11 illustrates the bonding of two wafers/chips, wherein one of the wafer/chip is a Backside Illumination (BSI) image sensor chip/wafer.

Referring back to FIG. 2, in some embodiments, array-containing circuit 118 comprises image sensors (not shown) such as photo diodes, as schematically illustrated in FIG. 11. In these embodiments, chip 112 is an image sensor chip such as a Backside Illumination (BSI) image sensor chip. Some details of an exemplary BSI image sensor chip 112 are schematically illustrated in FIG. 11. In alternative embodiments, array-containing circuit 118 comprises memory cells including, and not limited to, Static Random Access Memory (SRAM) cells, Dynamic Random Access Memory (DRAM) Cells, Magneto-Resistive Random Access Memory (MRAM) cells, or the like. In yet alternative embodiments, array-containing circuit 118 comprises both an image sensor array and a memory array.

Figure 3:
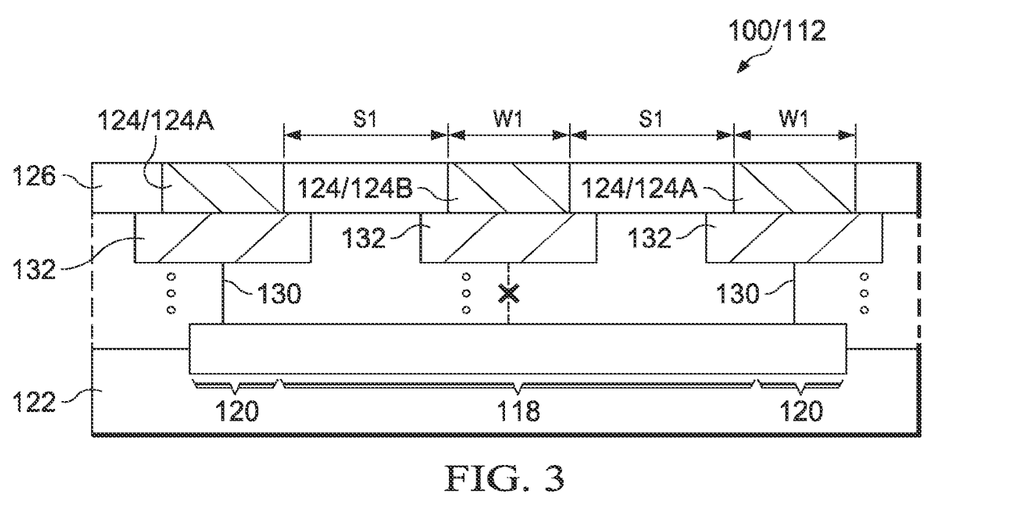
FIG. 3 illustrates a schematic cross-sectional view of a chip in the first wafer in accordance with some embodiments.

FIG. 3 illustrates a schematic cross-sectional view of chip 112. Chip 112 includes semiconductor substrate 122, which may be a silicon substrate, a silicon germanium substrate, a silicon carbon substrate, an III-V compound semiconductor substrate, or the like. Array-containing circuit 118 is formed at the surface or inside semiconductor substrate 122. For example, when array-containing circuit 118 comprises image sensors such as photo diodes, the photo diodes may be formed inside semiconductor substrate 122. When array-containing circuit 118 comprises SRAM cells, the SRAM cells may be formed at a surface of semiconductor substrate 122.

It is appreciated that chip 112 is schematically illustrated, and the details of chips 112, such as color filters and micro lenses (when chip 112 is an image sensor chip), are not illustrated for clarity.

In addition to array-containing circuit 118, chip 112 may further include peripheral circuits 120 such as the circuits for processing the signals generated by array-containing circuit 118. For example, peripheral circuits 120 may include Image Signal Processing (ISP) circuits such as Analog-to-Digital Converters (ADCs), Correlated Double Sampling (CDS) circuits, row decoders, and/or the like.

Chip 112 includes surface dielectric layer 126 formed at the surface of wafer 100. In some embodiments, surface dielectric layer 126 is an oxide layer, which may comprise silicon oxide. In alternative embodiments, surface dielectric layer 126 comprises other silicon and/or oxygen containing materials such as SiON, SiN, or the like. Metal pads 124 are formed in surface dielectric layer 126, and may be electrically coupled to circuits 118 and/or 120 through metal lines and vias, which are represented by lines 130. Metal pads 124 may be formed of copper, aluminum, nickel, tungsten, or alloys thereof. The top surface of surface dielectric layer 126 and the top surfaces of metal pads 124 are level with each other, which is achieved through a planarization that is performed during the formation of metal pads 124. The planarization may comprise Chemical Mechanical Polish (CMP).

Metal pads 124 may be electrically connected to metal pads 132 (which may also be metal lines). Metal pads 132 are parts of a top metallization layer that includes metal lines and/or metal pads. In some embodiments, no metal vias are formed between metal pads 132 and metal pads 124. Accordingly, metal pads 132 may be in physical contact with metal pads 124. In the embodiments in which chip 112 includes array-containing circuit 118, since the array cells 128 (FIG. 4) has a repeated pattern, metal pads 132 may be formed to align to the respective underlying array cells 128, so that the electrical connection paths between array cells 128 and metal pads 132 are shortened, and the metal routing for the electrical connection paths is easy. Accordingly, when chip 112 comprises array-containing circuit 118, metal pads 132 may be directly connected to metal pads 124 without adding vias in between.

As shown in FIGS. 2 and 3, metal pads 124 are distributed uniformly or substantially uniformly (for example, with a pattern-density variation smaller than about 10 percent). The (substantially) uniformly distributed metal pads 124 may be distributed throughout an entirety or substantially the entirety of (for example, more than 90 or 95 percent) of chip 112. The (substantially) uniformly distributed metal pads 124 may extend all the way to the edges of chip 112. Furthermore, all or substantially all (such as more than 90 percent) of metal pads 124 throughout the entire chip 112 may have a same top-view shape, a same top-view size, and/or a same pitch. Accordingly, metal pads 124 may have a uniform pattern density throughout chip 112.

Metal pads 124 include a plurality of active metal pads 124A and a plurality of dummy pads 124B. Dummy metal pads 124B do not have electrical functions. Active metal pads 124A may be electrically connected to circuits 118 or 120, wherein the electrical connection is represented by lines 130, which represent metal lines and vias. Dummy metal pads 124B are electrically disconnected from the circuits in chip 112, wherein the symbol "x" represents that no electrical connection exists to connect dummy metal pads 124B to circuits 118 and/or 120. Accordingly, dummy metal pads 124B may be electrically floating. In some embodiments, active metal pads 124A and dummy metal pads 124B have the same top-view shape, the same top-view size, and comprise the same material. Furthermore, active metal pads 124A and dummy metal pads 124B are formed simultaneously. In alternative embodiments, active metal pads 124A and dummy metal pads 124B have different top-view shapes and/or different top-view sizes.

As shown in FIGS. 2 and 3, active metal pads 124A and dummy metal pads 124B may a same top-view shape and/or a same top-view size. Therefore, whether a metal pad 124 is used as an active metal pad 124A or a dummy metal pad 124B is determined by its electrical connection such as whether it is connected to circuits 118 and 120 or not. The designers who design chip 112 may uniformly distribute metal pads 124 throughout chip 112 and/or wafer 100, and the electrical connections from circuits 118/120 to metal pads 124 are made depending on the convenience in metal routing. For example, when an electrical connection needs to be made to connect to a part of circuits 118/120, the most convenient metal pad 124, which may be the one nearest to the part of circuits 118/120, or the one that is easiest to route to, is selected as the active metal pad 124. The metal pads 124 that are not selected thus become dummy metal pads 124B.

Figure 5:
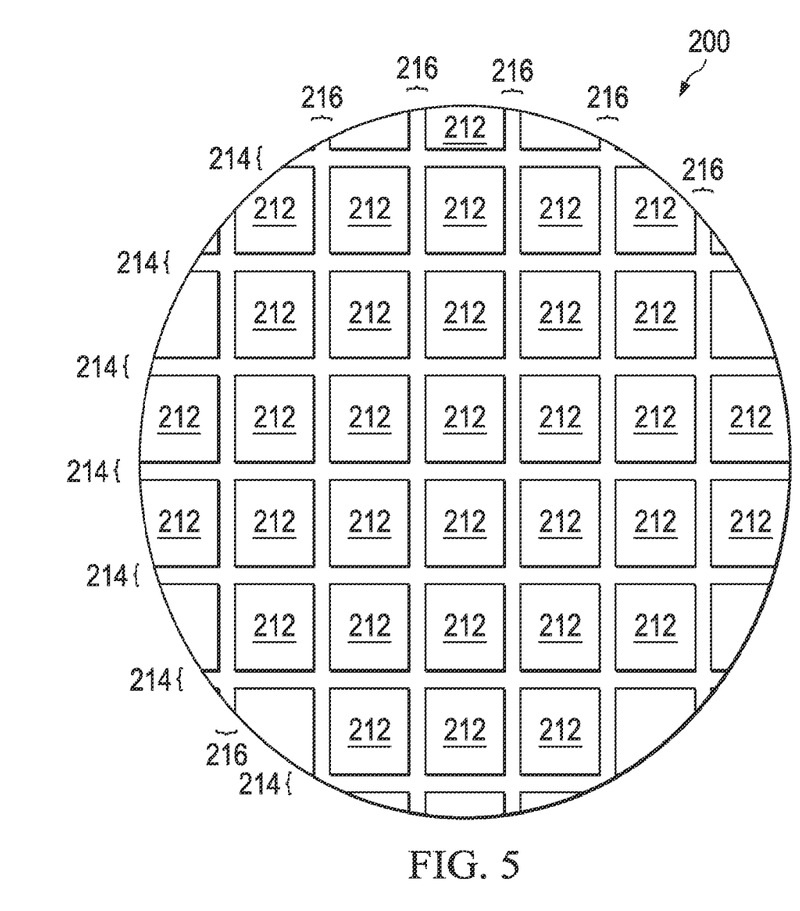
FIG. 5 illustrates a schematic top view of a second wafer in accordance with some embodiments.

FIG. 5 illustrates a schematic top view of wafer 200 in accordance with some exemplary embodiments. Wafer 200 includes chips 212 and the adjoining scribe lines 214 and 216, wherein scribe lines 214 and 216 separate chips 212 from each other. In each of chips 212, there may is a seal ring (not shown in FIG. 5, refer to 236 in FIG. 9) formed, wherein the outer boundaries of the seal rings define the outer boundaries of chips 212. Each of the scribe lines 214 is between and adjoining two rows of chips 212, and each of the scribe lines 216 is between and adjoining two columns of chips 212.

Figure 6:
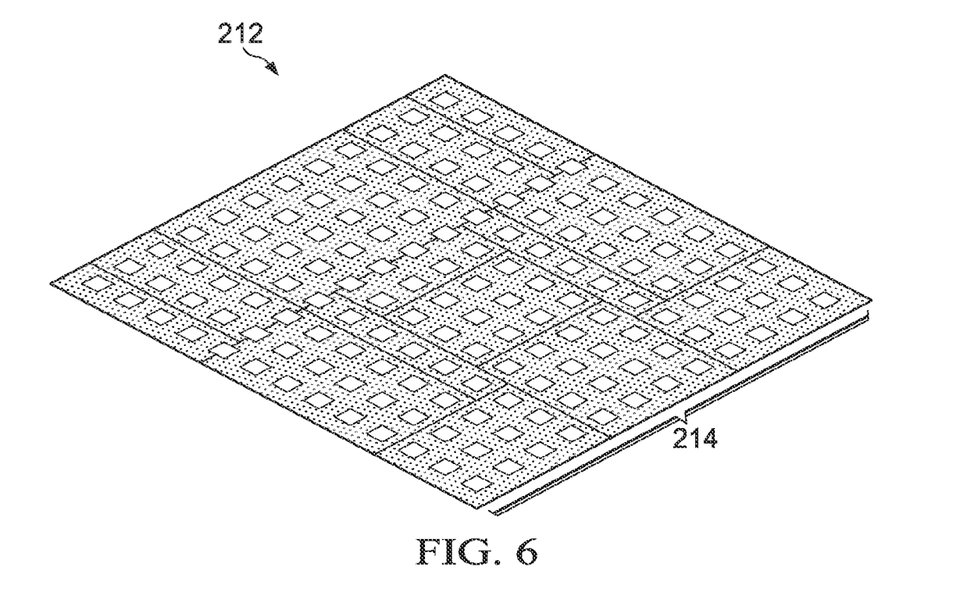
FIG. 6 illustrates a schematic perspective view of a chip in the second wafer in accordance with some embodiments.

FIG. 6 illustrates a schematic perspective view of chip 212, which is a part of wafer 200 in FIG. 5. In some embodiments, chip 212 is an Application Specific Integrated Circuit (ASIC) chip. For example, chip 212 may include ADCs, CDS, row decoders, or the like, which are schematically illustrated as circuits 220 in FIG. 7.

Figure 7:
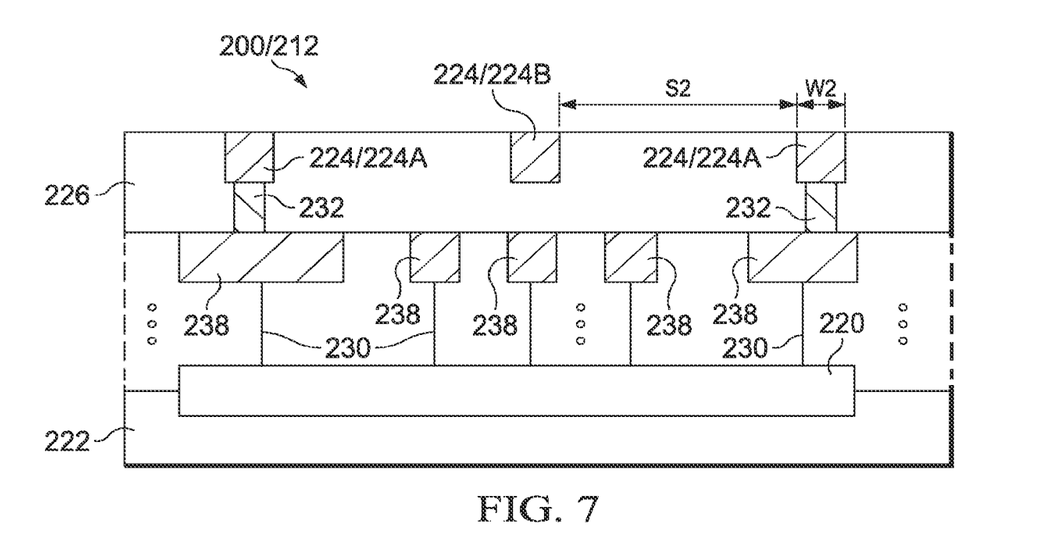
FIG. 7 illustrates a schematic cross-sectional view of a chip in the second wafer in accordance with some embodiments.

FIG. 7 illustrates a schematic cross-sectional view of chip 212. Chip 212 includes semiconductor substrate 222, which may be a silicon substrate, a silicon germanium substrate, a silicon carbon substrate, a III-V compound semiconductor substrate, or the like. Circuits 220, which active devices such as transistors, may be formed at a surface of semiconductor substrate 222.

Chip 212 includes surface dielectric layer 226 formed at the surface of wafer 200. In some embodiments, surface dielectric layer 226 is an oxide layer, which may comprise silicon oxide. In alternative embodiments, surface dielectric layer 226 comprises other materials such as SiON, SiN, or the like. Metal pads 224, and possibly, metal vias 232, are formed in surface dielectric layer 226, and may be electrically coupled to circuits 220 through metal lines and vias, which are represented by lines 230. Metal pads 224 may be formed of copper, aluminum, nickel, tungsten, or alloys thereof. The top surface of surface dielectric layer 226 and the top surfaces of metal pads 224 are level with each other, which is achieved through a planarization such as CMP.

Metal pads 224 are electrically connected to metal pads 238 (which may also be metal lines) through metal vias 232. Metal pads 238 are parts of a top metallization layer. Metal pads 224 and vias 232 in combination may form dual damascene structures, which are formed using dual-damascene processes. The bottom ends of metal vias 232 are over and contacting the top surfaces of metal pads 238.

As shown in FIG. 6, metal pads 224 are distributed uniformly or substantially uniformly (for example, with a pattern-density variation smaller than about 10 percent). The (substantially) uniformly distributed metal pads 224 may be distributed throughout an entirety or substantially the entirety of (for example, more than 90 or 95 percent) of chip 212. The (substantially) uniformly distributed metal pads 224 may extend all the way to the edges of chip 212. Furthermore, all or substantially all of (such as more than 90 percent) metal pads 224 throughout the entire chip 212 may have a same top-view shape, a same top-view size, and/or a same pitch as each other. Accordingly, metal pads 224 may have a uniform pattern density throughout chip 212. The width W2 (FIG. 7) of metal pads 224 may be smaller than width W1 of metal pads 124 (FIG. 3) in some embodiments, in alternative embodiments, width W2 of metal pads 224 is equal to or greater than width W1 of metal pads 124.

Metal pads 224 include active metal pads 224A and dummy pads 224B. Active metal pads 224A may be electrically connected to circuits 220, wherein the electrical connections are represented by lines 230. Dummy metal pads 224B are electrically disconnected from the circuits in chip 212. Dummy metal pads 224B may be electrically floating. In some embodiments, dummy metal pads 224B do not have any underlying metal vias connected to them. Hence, the bottom surfaces of metal pads 228 may be in contact with a top surface(s) of dielectric layer 226. In some embodiments, active metal pads 224A and dummy metal pads 224B have the same top-view shape, the same top-view size, and comprise the same material. Furthermore, active metal pads 224A and dummy metal pads 224B are formed simultaneously. In alternative embodiments, active metal pads 224A and dummy metal pads 224B have different top-view shapes and/or different top-view sizes.

As shown in FIGS. 6 and 7, active metal pads 224A and dummy metal pads 224B have a same top-view shape and/or a same top-view size. Therefore, whether a metal pad 224 is used as an active metal pad 224A or a dummy metal pad 224B is determined by its electrical connection such as whether it is connected to circuits 220. The designers of chip 212 thus may uniformly distribute metal pads 224 throughout chip 212, and the electrical connections from circuits 220 to metal pads 224 are made depending on the convenience in metal routing. For example, when an electrical connection needs to be made to connect to a part of circuits 220, the most convenient metal pad 224, which may be the one nearest to the part of circuits 220 or the one that is easiest to route to, is selected as the active metal pad 224A. The metal pads 224 that are not selected thus become dummy metal pads 224B, which do not have underlying vias 232.

Figure 8:
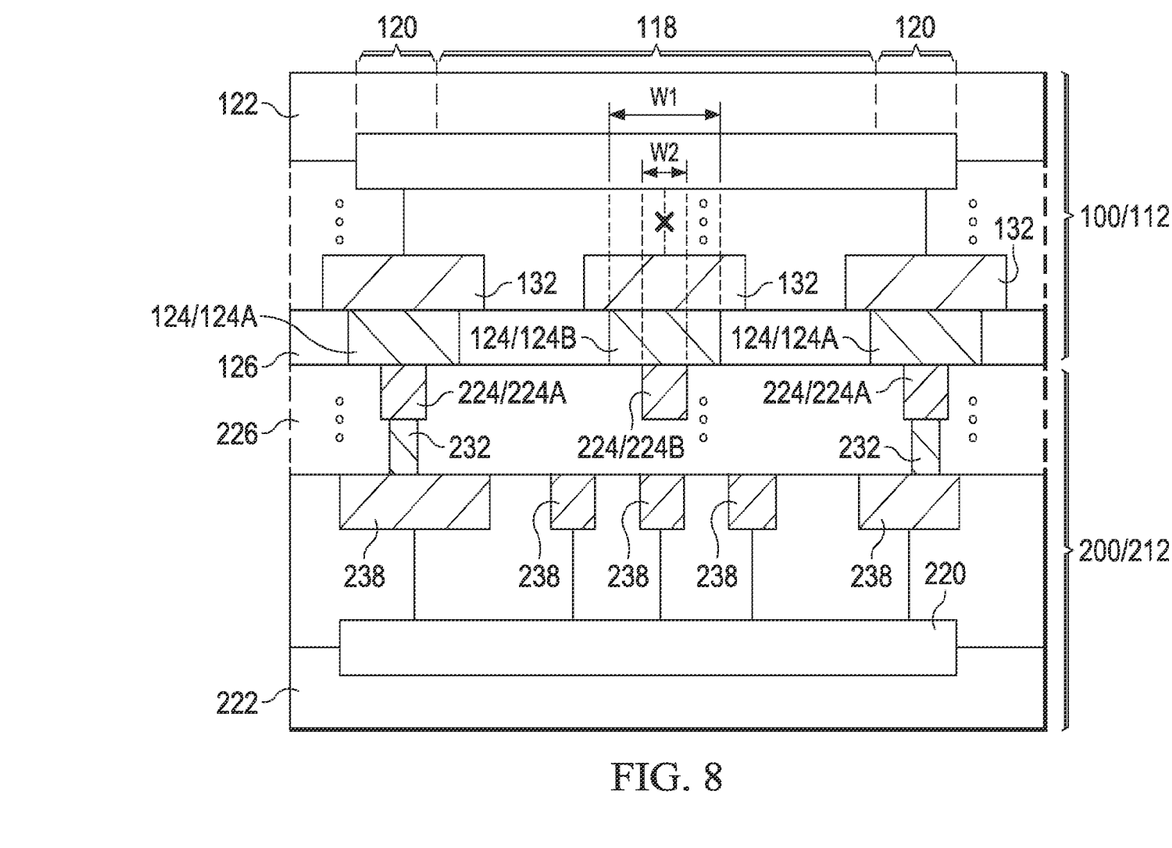
FIG. 8 illustrates the bonding of the first wafer to the second wafer in accordance with some embodiments.

FIG. 8 illustrates the wafer-level bonding of wafer 100 to wafer 200 through hybrid bonding, wherein chips 112 are bonded to chips 212. In the hybrid bonding of wafers 100 and 200, surface dielectric layer 126 is bonded to surface dielectric layer 226 through fusion bonding, and metal pads 124 are bonded to metal pads 224 through metal-to-metal bonding. The bonding includes pre-bonding and an annealing. During the pre-bonding, a small pressing force is applied to press wafers 100 and 200 against each other. The pre-bonding may be performed at the room temperature (for example, between about 21° C. to about 25° C.), although higher temperatures may be used.

After the pre-bonding, surface dielectric layer 126 and 226 are bonded to each other. The bonding strength is improved in a subsequent annealing step, in which the bonded wafers 100 and 200 are annealed at a temperature between about 300° C. and about 400° C., for example. The annealing may be performed for a period of time between about 1 hour and 2 hours. When temperature rises, the OH bond in surface dielectric layers 126 and 226 break to form strong Si—O—Si bonds, and hence wafers 100 and 200 are bonded to each other through fusion bonds (and through Van Der Waals force). In addition, during the annealing, the metal (such as copper) in metal pads 124 and 224 diffuse to each other, so that metal-to-metal bonds are also formed. Hence, the resulting bonds between wafers 100 and 200 are hybrid bonds. After the bonding, the bonded wafer 100 and 200 are sawed into packages, with each of the packages including chip 112 bonded to chip 212.

As shown in FIG. 8, with width W1 of metal pads 124 being different from width W2 of metal pads 224, when misalignment occurs, and wafer 100 shifts relative to wafer 200, the contacting area between metal pads 124 and the respective metal pads 224 does not change, and hence the contact resistance does not change. As a comparison, if metal pads 124 have same top-view sizes as metal pads 224, when wafer 100 shifts relative to wafer 200, the contact area decreases, and the contact resistance increases due to the reduced contacting area. In the top view of the bonded structure in FIG. 8, metal pads 124 may extend beyond the edges of the respective underlying metal pads 224 in all directions.

As also shown in FIG. 8, metal pads 124 and metal pads 224 are bonded to each other with a one-to-one correspondence. In some embodiments, each of all metal pads 124 have a corresponding metal pad 224 to bond to, and each of all metal pads 224 have a corresponding metal pad 124 to bond to. Active metal pads 124A are bonded to active metal pads 224A, and dummy metal pads 124B are bonded to dummy metal pads 224B.

Figure 9:
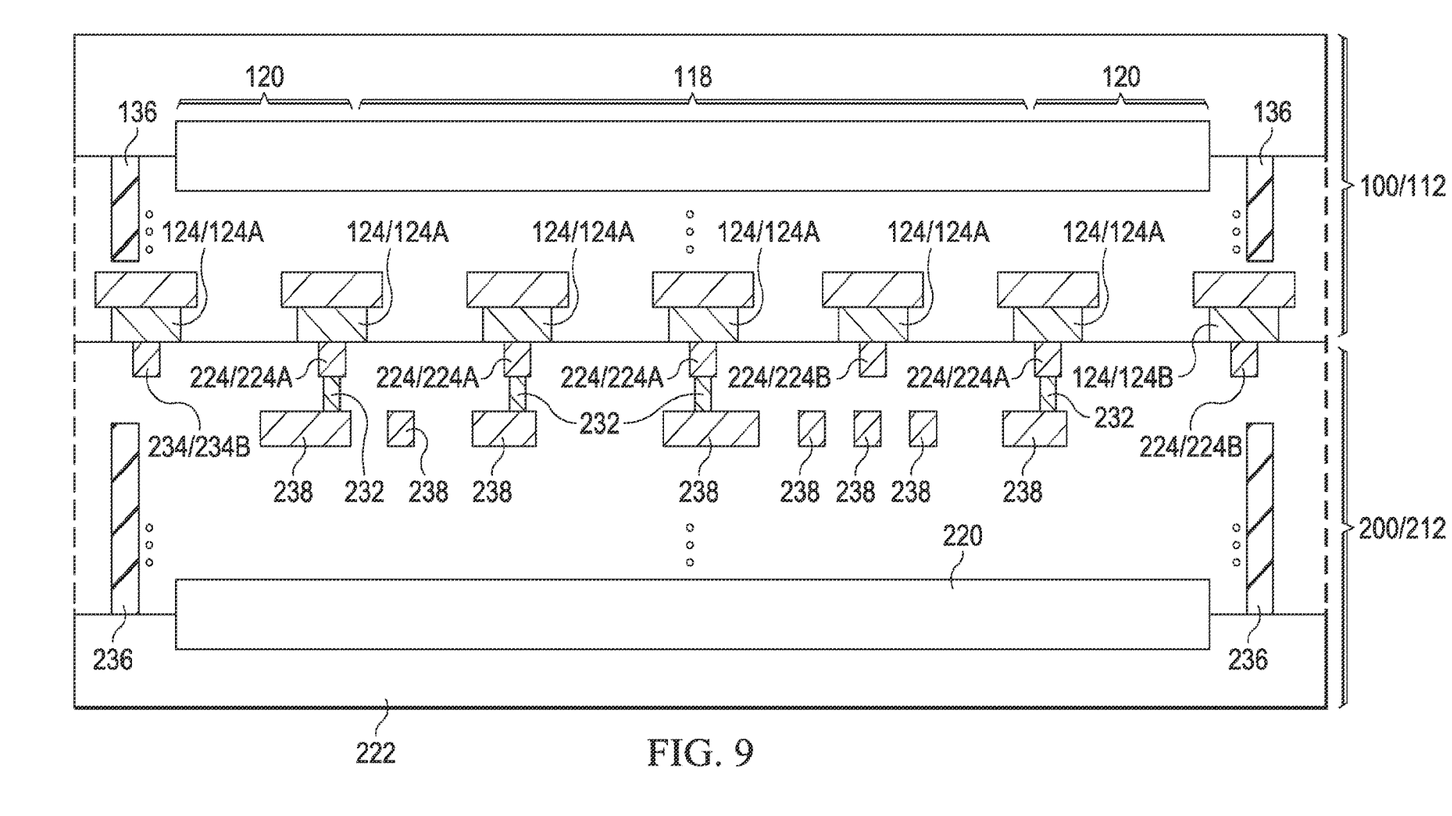
FIG. 9 illustrates the bonding of the first wafer to the second wafer in accordance with some embodiments, wherein seal rings are illustrated.

FIG. 9 illustrates seal rings 136 and 236, which are formed as the rings adjacent to the edges of the respective chips 112 and 212. The rest parts of wafers 100/200 and chips 112/212 may be essentially the same as in the embodiments shown in FIG. 8. In some embodiments, metal pads 124 and 224 are aligned to the seal rings 136 and 236, respectively, so that metal pads 124 and 224 are distributed all the way to the edges of chips 112 and 212, respectively. This results in the improvement in the pattern density of metal pads 124 and 224 at the edges of chips 112 and 212. In some embodiments, one (or more) of metal pads 124 has a part (and not a whole) aligned to seal ring 136. In alternative embodiments, an entirety of one or more of metal pads 124 is aligned to a part of seal ring 136. Similarly, a part (but not a whole) of one (or more) of metal pads 224 is aligned to seal ring 236 with a partial overlapping. In alternative embodiments, an entirety of one (or more) of metal pads 224 is aligned to a part of seal ring 236.

Figure 10:
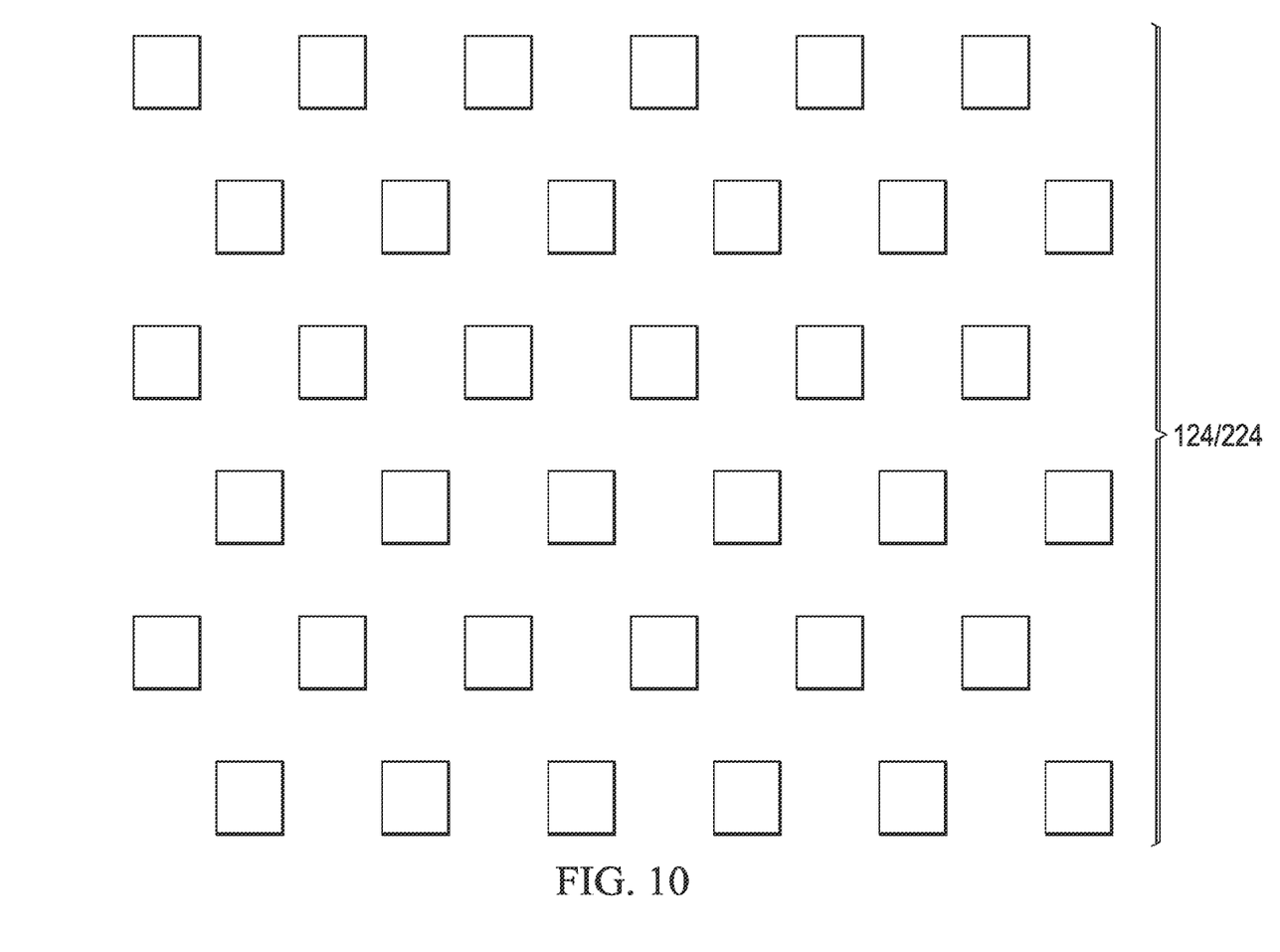
FIG. 10 illustrates the distribution of metal pads in the first wafer and the second wafer in accordance with alternative embodiments.

FIG. 10 illustrates the top view of metal pads 124 and 224 in alternative embodiments, wherein metal pads 124 and 224 are distributed to have a beehive pattern. It is appreciated that metal pads 124 and 224 may have any other repeated patterns other than illustrated.

FIG. 11 illustrates the cross-sectional view of some exemplary packages, in which chip 112 is a BSI image sensor chip, and the corresponding wafer 100 is an image sensor wafer. Some of the features as illustrated in FIGS. 1 through 10 are also illustrated in FIG. 11. The details of these features may be found referring to the discussions of FIGS. 1 through 10, and are not repeated herein.

FIG. 11 illustrates that array-containing circuit 118 comprises photo diodes 138 that form an array, wherein photo diodes 138 are formed in semiconductor substrate 122. In addition, array-containing circuit 118 also includes transistors (represented by transistors 140) that are also comprised in image sensor units (pixel units). The transistors may include transfer gate transistors, reset transistors, select transistors, follower transistors, and/or the like. Transistors 140 are formed on the front side (the side facing down in FIG. 11) of semiconductor substrate 122.

Metal grid 146 is formed on the backside of semiconductor substrate 122. Metal grid 146 includes a first plurality of metal lines extending in a first direction, and a second plurality of metal lines extending in a second direction perpendicular to the first direction. The first and the second plurality of metal lines are interconnected to form the grid. The spaces defined the grid are filled with a transparent oxide to form transparent oxide regions 147. Transparent oxide regions 147 are aligned to photo diodes 138. In addition, color filters 148 and micro-lenses 150 are formed over transparent oxide regions 147, and also form arrays.

In addition, BSI chip 112 may also include bond balls (also referred to as bond studs) 152, which are formed by forming wire bonding to metal pads 156, which are on the back side of BSI chip 112. Bond studs 152 are over and contacting respective conductive pads 156, which are further over and in contact with an underlying dielectric layer as illustrated. Bond studs 152 have curved top surfaces. Bond wires 154, which are also curved, are connected to bond studs 152. As shown in FIG. 11, semiconductor substrate 122 has a top surface and a bottom surface. At least a portion of the bond studs 152 are lower than the illustrated top surface of semiconductor substrate 122, and higher than the illustrated bottom surface of semiconductor substrate 122. Bond wires 154 are electrically coupled to the circuits (such as array-containing circuit 118) in BSI chip 118. Bond wires 154 may also be electrically coupled to circuit 220 through metal pads 124 and 224.

The embodiments of the present disclosure have some advantageous features. By adding dummy metal pads in the hybrid bonding, and by uniformly distributing the metal pads, the pattern-loading effect and dishing effect in the CMP of metal pads 124 and 224 are reduced, and the surfaces of the wafers are more planar. Hence, the defects resulted from the dishing effect is reduced, wherein the defects include air bubbles separating the metal pads that are intended to be bonded together. The ratio (W1/S1 (FIG. 3) and W2/S2 (FIG. 7)), which are the metal pad width to metal pad spacing ratio, may be increased to 1:2 or even 1:1 without causing the dishing effect. In conventional hybrid bond schemes, however, to make the dishing effect to be at an acceptable low level, the ratio of metal pad width to metal pad spacing needs to be smaller than 1:5. Accordingly, in the embodiments of the present disclosure, the metal pads may be placed close to each other, and more metal pads (such as dummy metal pads) may be added. With more metal pads to choose from (while other metal pads are dummy metal pads), the metal routing is easier.

In accordance with some embodiments of the present disclosure, a chip includes a semiconductor substrate, integrated circuits with at least portions in the semiconductor substrate, and a surface dielectric layer over the integrated circuits. A plurality of metal pads is distributed substantially uniformly throughout substantially an entirety of a surface of the chip. The plurality of metal pads has top surfaces level with a top surface of the surface dielectric layer. The plurality of metal pads includes active metal pads and dummy metal pads. The active metal pads are electrically coupled to the integrated circuits. The dummy metal pads are electrically decoupled from the integrated circuits.

In accordance with some other embodiments of the present disclosure, an integrated circuit structure includes a first chip and a second chip. The first chip includes a first surface dielectric layer, and a first plurality of metal pads uniformly distributed throughout substantially an entirety of a surface of the first chip. The first plurality of metal pads includes first active metal pads in the first surface dielectric layer, and first dummy metal pads in the first surface dielectric layer. The second chip is over and bonded to the first chip through hybrid bonding. The second chip includes a second surface dielectric layer bonded to the first surface dielectric layer, and a second plurality of metal pads. The second plurality of metal pads includes second active metal pads bonded to the first active metal pads with a one-to-one correspondence, and second dummy metal pads bonded to the first dummy metal pads with a one-to-one correspondence.

In accordance with some other embodiments of the present disclosure, an integrated circuit structure includes a first chip and a second chip. The first chip includes an integrated circuit having an array, a first surface dielectric layer over the image sensor array, and a first plurality of metal pads uniformly distributed throughout an entirety of the first surface dielectric layer. The first plurality of metal pads includes first active metal pads electrically coupled to the integrated circuit, a plurality of metal vias underlying and joined to respective ones of the first active metal pads, and first dummy metal pads. The bottom surfaces of the first dummy metal pads are in contact with top surfaces of an underlying dielectric material. The second chip is over and bonded to the first chip through hybrid bonding. The second chip is an ASIC chip, and includes a second surface dielectric layer bonded to the first surface dielectric layer, and a second plurality of metal pads uniformly distributed throughout the second surface dielectric layer. The second plurality of metal pads includes second active metal pads bonded to the first active metal pads, second dummy metal pads bonded to the first dummy metal pads, and a third plurality of metal pads underlying and in contact with top surfaces of respective ones of the second plurality of metal pads.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit structure comprising:
   a first chip comprising:
      a semiconductor substrate;
      a first dielectric layer underlying the semiconductor substrate;
      a first plurality of metal pads distributed substantially uniformly, wherein the first plurality of metal pads comprise:
         first metal pads overlapped by the semiconductor substrate; and
         second metal pads on opposite sides of the first metal pads and vertically misaligned from the semiconductor substrate; and
      a seal ring proximate edges of the first chip, wherein some of the first plurality of metal pads extend directly underlying the seal ring.

2. The integrated circuit structure of claim 1 further comprising:
   a second dielectric layer over and contacting the first dielectric layer, wherein additional opposing edges of the second dielectric layer contact opposing edges of the semiconductor substrate to form vertical interfaces.

3. The integrated circuit structure of claim 1, wherein the first plurality of metal pads are distributed to an area more than about 90 percent of a chip area of the first chip.

4. The integrated circuit structure of claim 1, wherein the first plurality of metal pads are distributed to regions proximate edges of the first chip.

5. The integrated circuit structure of claim 1 further comprising:
   a plurality of bond pads comprising portions over the first dielectric layer;
   a plurality of bond studs, each over and contacting one of the plurality of bond pads; and
   a plurality of bond wires, wherein the plurality of bond wires are curved, and wherein each of the plurality of bond wires is joined with one of the plurality of bond studs.

6. The integrated circuit structure of claim 1 further comprising a second chip, wherein the second chip comprises:
   a second plurality of metal pads, each bonded to one of the first plurality of metal pads.

7. The integrated circuit structure of claim 1, wherein the first chip further comprises a plurality of image sensors in the semiconductor substrate.

8. The integrated circuit structure of claim 7, wherein the first chip further comprises micro lenses overlapping the plurality of image sensors.

9. The integrated circuit structure of claim 1, wherein the first plurality of metal pads comprise active metal pads and dummy metal pads.

10. The integrated circuit structure of claim 9, wherein the active metal pads and the dummy metal pads have same top-view shapes and same top-view sizes.

11. The integrated circuit structure of claim 1, wherein the first chip comprises a backside image sensor chip.

12. An integrated circuit structure comprising:
    a first chip comprising:
       a semiconductor substrate;
       a first dielectric layer underlying the semiconductor substrate;
       a first plurality of metal pads distributed substantially uniformly, wherein the first plurality of metal pads comprise:
          first metal pads overlapped by the semiconductor substrate; and
          second metal pads on opposite sides of the first metal pads and vertically misaligned from the semiconductor substrate;
       a seal ring proximate edges of the first chip, wherein some of the first plurality of metal pads extend directly underlying the seal ring;
    a plurality of bond pads comprising portions over the first dielectric layer;
    a plurality of bond studs, each over and contacting one of the plurality of bond pads; and
    a plurality of bond wires, wherein the plurality of bond wires are curved, and wherein each of the plurality of bond wires is joined with one of the plurality of bond studs.

13. The integrated circuit structure of claim 12 further comprising:
    a second dielectric layer over and contacting the first dielectric layer, wherein additional opposing edges of the second dielectric layer contact opposing edges of the semiconductor substrate to form vertical interfaces.

14. The integrated circuit structure of claim 12, wherein the first plurality of metal pads are distributed to an area more than about 90 percent of a chip area of the first chip.

15. The integrated circuit structure of claim 12 further comprising a second chip, wherein the second chip comprises:
    a second plurality of metal pads, each bonded to one of the first plurality of metal pads.

16. The integrated circuit structure of claim 12, wherein the first chip further comprises a plurality of image sensors in the semiconductor substrate.

17. The integrated circuit structure of claim 12, wherein the first plurality of metal pads comprise active metal pads and dummy metal pads.

18. An integrated circuit structure comprising:
    a first chip comprising:
       a semiconductor substrate;
       a first dielectric layer underlying the semiconductor substrate;
       a first plurality of metal pads distributed substantially uniformly, wherein the first plurality of metal pads comprise:
          first metal pads overlapped by the semiconductor substrate; and
          second metal pads on opposite sides of the first metal pads and vertically misaligned from the semiconductor substrate; and
       a seal ring proximate edges of the first chip, wherein some of the first plurality of metal pads extend directly underlying the seal ring; and a second chip, wherein the second chip comprises a second plurality of metal pads, each physically joined to one of the first plurality of metal pads.

19. The integrated circuit structure of claim 18 further comprising:
a second dielectric layer over and contacting the first dielectric layer, wherein additional opposing edges of the second dielectric layer contact opposing edges of the semiconductor substrate to form vertical interfaces.

20. The integrated circuit structure of claim 18, wherein the first plurality of metal pads comprise active metal pads and dummy metal pads, and wherein the active metal pads and the dummy metal pads have same top-view shapes and same top-view sizes.

* * * * *